(12) United States Patent
Lauxtermann et al.

(10) Patent No.: US 7,009,648 B2
(45) Date of Patent: Mar. 7, 2006

(54) METHOD FOR OPERATING A CMOS IMAGE SENSOR

(75) Inventors: Stefan Lauxtermann, Berikon (CH); Steve Tanner, Yverdon-les-Bains (CH); Joachim Grupp, Enges (CH)

(73) Assignee: Asulab S.A., Bienne (CH)

( * ) Notice: Subject to any disclaimer, the term of this patent is extended or adjusted under 35 U.S.C. 154(b) by 913 days.

(21) Appl. No.: 09/784,598

(22) Filed: Feb. 15, 2001

(65) Prior Publication Data

US 2001/0015831 A1    Aug. 23, 2001

(30) Foreign Application Priority Data

Feb. 22, 2000   (CH) ..................................... 0340/00

(51) Int. Cl.
*H04N 3/14*  (2006.01)

(52) U.S. Cl. .................. 348/308; 250/208.1; 257/214; 257/292

(58) Field of Classification Search ............... 348/302, 348/308, 303, 304, 296; 257/291, 297, 214, 257/292; 250/208.1

See application file for complete search history.

(56) References Cited

U.S. PATENT DOCUMENTS

| | | | |
|---|---|---|---|
| 4,839,735 A |   | 6/1989 | Kyomasu et al. |
| 5,986,297 A | * | 11/1999 | Guidash et al. ............. 257/223 |
| 6,243,134 B1 | * | 6/2001 | Beiley ........................ 348/308 |
| 6,486,503 B1 | * | 11/2002 | Fossum ....................... 257/215 |
| 6,667,768 B1 | * | 12/2003 | Fossum ....................... 348/308 |

FOREIGN PATENT DOCUMENTS

| WO | WO99/44359 | 9/1999 |
|---|---|---|
| WO | WO00/05874 | 2/2000 |

OTHER PUBLICATIONS

Kyomasu, A New MOS Imager Using Photodiode as Current Source, Aug 26, 1991, IEEE Journal of Solid-State Circuits, vol. 26, No. 8, New York, USA.

* cited by examiner

*Primary Examiner*—Thai Tran
*Assistant Examiner*—Gary C. Vieaux
(74) *Attorney, Agent, or Firm*—Sughrue Mion, PLLC

(57) ABSTRACT

The present invention concerns a method for operating a CMOS image sensor including a matrix of pixels arranged in a plurality of lines and columns. Each of the pixels include a photosensor element that accumulates charge carriers in proportion to the illumination. A storage device is able to be coupled to the photosensor element at a determined instant in order to generate a sampled signal, which is representative of the charge carriers accumulated by the photosensor. The storage device is intended to assure storage for the purpose of reading the sampling signal. According to the present invention, when the sampled signal which is stored across the storage means is read, the photosensor element is held at a voltage such that any charge carrier generated by the latter is drained and thus does not disturb the sampled signal stored on the storage device. The problem of diffusion of charge carriers typically encountered with such sensors when they are operated in accordance with conventional techniques is thus answered. This method allows use of such a sensor for applications where the exposure time of an image is a determining factor because it is very short.

5 Claims, 2 Drawing Sheets

US 7,009,648 B2

METHOD FOR OPERATING A CMOS IMAGE SENSOR

BACKGROUND OF THE INVENTION

The present invention generally concerns a method for operating an integrated image sensor. More particularly, the present invention concerns a method for operating an integrated image sensor using CMOS technology. Such CMOS image sensors are intended, in particular, for making integrated photographic and video devices.

As a result of current integration technologies, it is possible to make an operational image capturing device in integrated form. Such an integrated image capturing device incorporates, on the same chip, a photo-sensor component formed of an assembly of photo-sensor elements typically organised in the form of a matrix, and a processing component intended to capture images and read the data picked up by the photo-sensor component.

Traditionally, integrated image capturing devices rely on charge transfer techniques. According to these techniques, photo-generated charges are collected and transferred in a determined manner. The most commonly used charge transfer techniques use CCD (charge-coupled devices) or CID (charge injection devices) components. Although these devices using these components have found numerous commercial applications, they nonetheless have serious drawbacks. In particular, these components rely on non standard manufacturing techniques, and in particular standards incompatible with standard CMOS manufacturing processes. Such components thus constitute obstacles, in terms of cost and ease of manufacturing, to the total integration of image sensors.

As a complement to the aforementioned techniques, a concept has been developed around the use of p-n semiconductor junctions as photo-sensor elements, these junctions being commonly called photodiodes. The essential advantage of such elements is their perfect compatibility with standard CMOS manufacturing processes. Thus, solutions relying on photodiodes as photo-sensor elements are known from the prior art, in particular from the document "A Random Access Photodiode Array for Intelligent Image Capture" by Orl Yadid-Pecht, Ran Ginosar and Yosi Diamand, IEEE Transactions on Electron Devices, Vol. 38, no. 8, August 1991, pp 1772–1780, incorporated here by reference.

SUMMARY OF THE INVENTION

This document thus discloses an integrated image sensor using CMOS technology in the form of a single chip. The architecture of the sensor, which is similar to that of RAM memories, is illustrated in FIG. 1. This sensor, indicated generally by reference numeral 1, includes a matrix 10 of pixels arranged in M lines and N columns. This matrix 10 occupies most of the surface of the sensor. The reading of a particular pixel of matrix 10 is effected by addressing the corresponding line and column. For this purpose, the sensor further includes a line addressing circuit 20 coupled to matrix 10 and an output bus 30 coupled to the columns of matrix 10, both controlled by a control circuit 40.

Each pixel of matrix 10 has a structure like the illustration of FIG. 2A. This pixel, generally indicated by reference numeral 50 in FIG. 2A, includes a photosensor element PD, a first stage A1, storage means C1 and a second stage A2. Photo-sensor element PD is formed of an reverse polarised photodiode which collects the photo-generated electrons during an integration period. First stage A1 is a sample-and-hold type circuit assuring sampling, at a determined time, of the value of the voltage present across the terminals of photodiode PD. This sampled value is stored in storage means C1 which is typically formed of a capacitor. It will be noted that the value of the voltage stored in capacitor C1 will depend of the transfer function of first stage A1 and in particular on the ratio between the capacitance value of photodiode PD and the capacitance of storage means C1. Second stage A2 assures the reading of the sampled voltage stored in storage means C1. The structure schematically described in FIG. 2A thus allows separation of the detection and reading processes.

Various embodiments are envisaged and presented in the aforementioned document of the prior art. FIG. 2B shows in particular one of these embodiments in which pixel 50 includes (n type) reverse polarised photodiode PD and five n-MOS type transistors M1 to M5. Each pixel 50 includes a memory node 55 formed of a capacitor (capacitor C1) and protected from the light, for example by a protective metal layer.

Transistor M1 assures initialisation of photodiode PD at a determined voltage before each integration period. Transistor M2 assures sampling of the charge accumulated by photodiode PD and storage of the signal thereby sampled at memory node 55. This transistor M2 further assures insulation or uncoupling of photodiode PD and memory node 55. Transistor M3 assures in particular initialisation of memory node 55 at a determined voltage. Transistor M4 is a source follower transistor and transistor M5 is a line selection transistor and assures, during the read process, transfer of the voltage of transistor M4 to an output bus common to all the pixels in one column. The signals applied to this structure include a high supply voltage $V_{DD}$ and a low supply voltage $V_{SS}$ forming earth, a first initialisation signal T1, a sampling signal SH, a second initialisation signal RST, and a line selection signal RSEL.

A first terminal of photodiode PD is connected to earth $V_{SS}$ and the other terminal is connected to the sources of transistors M1 and M2 the gates of which are respectively controlled by signals T1 and SH. The drains of transistors M1, M3 and M4 are connected to high supply voltage $V_{DD}$. The second initialisation signal RST is applied across the gate of transistor M3. The source of transistor M3, the drain of transistor M2 and the gate of transistor M4 are connected together to pixel memory node 55. The source of transistor M4 is connected, via line selection transistor M5, to the output bus common to all the pixels in one column. The line selection signal RSEL is applied to the gate of transistor M5.

One problem encountered, in terms of performance, with the structure of pixel 50 illustrated in FIG. 2B resides in the fact that the sampled charge stored on memory node 55 does not remain constant during the read process. Indeed, as it is described in the aforementioned document, the capacitance of memory node 55 is discharged relatively quickly because the charges photo-generated under photodiode PD have a long enough lifetime to diffuse in the substrate and discharge the capacitor of memory node 55 although that latter is protected from the light. This charge carrier diffusion problem is all the more pronounced the higher the intensity of the light on the photosensitive zone of the sensor. It will thus have been understood that this diffusion phenomenon drastically limits the time available for allowing reading of the sampled voltages stored on the pixel capacitor.

This problem thus limits the performance of the sensor. In particular, it will be desirable to perform global exposures of the sensor, i.e. to expose each pixel of the sensor matrix simultaneously in order, in particular, to obtain snapshots of a dynamic scene. In practice, the aforementioned charge carrier diffusion phenomenon will not allow reading of the stored sampled voltages since these voltages will have already varied substantially between the moment of reading the first and last lines of the pixel matrix.

One object of the present invention is thus to propose a method for operating a CMOS image sensor of the aforementioned type, which answers the problem of charge carrier diffusion encountered with such sensors.

Another object of the present invention is to propose a method for operating a CMOS image sensor of the aforementioned type which allows this sensor to be used for applications where the exposure time is a determining factor because it is very short.

Yet another object of the present invention is to propose a method for operating a CMOS image sensor of the aforementioned type which does not require the use of a mechanical shutter These objects are achieved, according to the present invention, as a result of the method whose characteristics are listed in claim 1.

Variants of the method according to the present invention form the subject of the dependent claims.

One advantage of the method according to the present invention resides in the fact that once the charges accumulated by the photodiode during the integration period have been sampled and stored on the storage capacitor of each pixel, the photodiode voltage is directly brought to its initialisation voltage for the next acquisition. Consequently, each photo-generated charge is captured or drained and thus does not diffuse in the substrate as far as the memory node. The signal sampled on each pixel of the sensor thus remains constant. The process of reading each pixel, line by line, can thus occur in a conventional manner, without any additional exposure time being necessary.

According to the present invention, the use of the image sensor is thus made possible for applications where the exposure time is very short. The total duration necessary for the exposure and processing of an image is also greatly reduced. One could thus speak of a global shutter.

Another advantage of the present invention lies in the fact that the exposure and reading operations are made entirely independent. An electronic shutter is thus effectively made so that mechanical shutter means are no longer necessary to allow the image capturing device to operate properly. The manufacturing costs of these devices is thus also reduced.

BRIEF DESCRIPTION OF THE FIGURES

These objects, features and advantages of the present invention, in addition to others, will appear more clearly on reading the following detailed description, made with reference to the annexed drawings given by way of non limiting examples and in which.

DETAILED DESCRIPTION OF THE INVENTION

Figure 1:
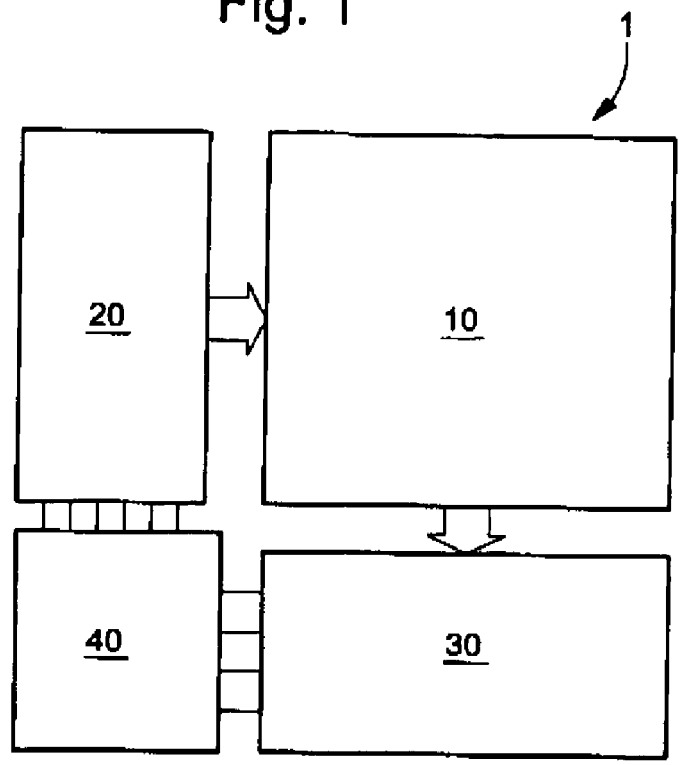
FIG. 1, already discussed, illustrates schematically the conventional architecture of a CMOS image sensor.
Figure 3:
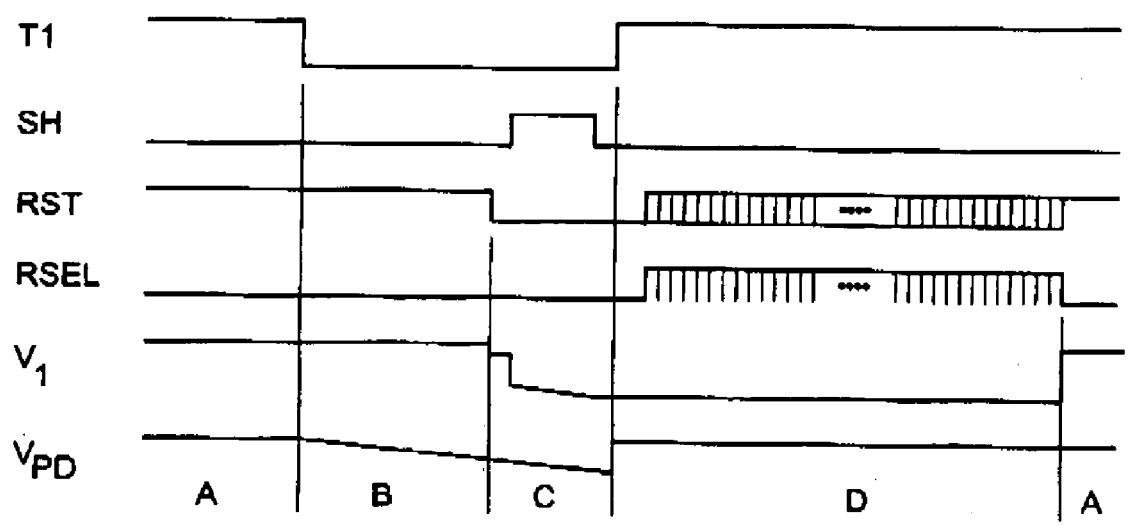
FIG. 3 is a temporal diagram illustrating, according to the present invention, the sequence of signals applied to the pixel structure of FIG. 2B.

The method according the invention, which allows pixel 50 of FIG. 2B to be operated, will now be described by means of FIG. 3. FIG. 3 thus shows a temporal diagram of the evolution of control signals T1, SH, RST and RSEL allowing the pixel structure of FIG. 2B to be operated. The evolution of voltage $V_{PD}$ of photodiode PD and the evolution of voltage $V_1$ at pixel memory node 55 have also been schematised in this Figure.

Figure 2A:
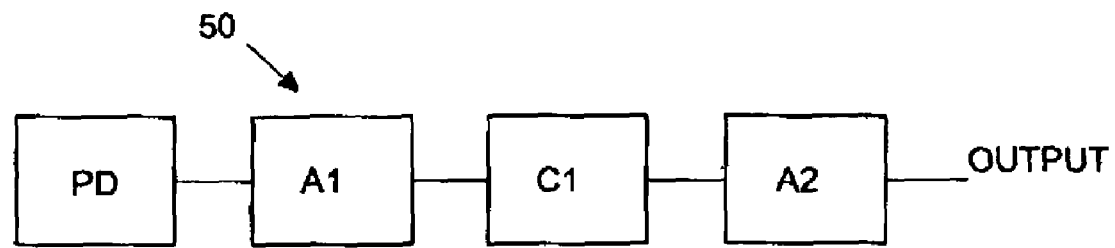
FIGS. 2A and 2B, already presented, illustrate respectively a flow diagram and a detailed diagram of a known structure of a CMOS image sensor pixel of FIG. 1.
Figure 2B:
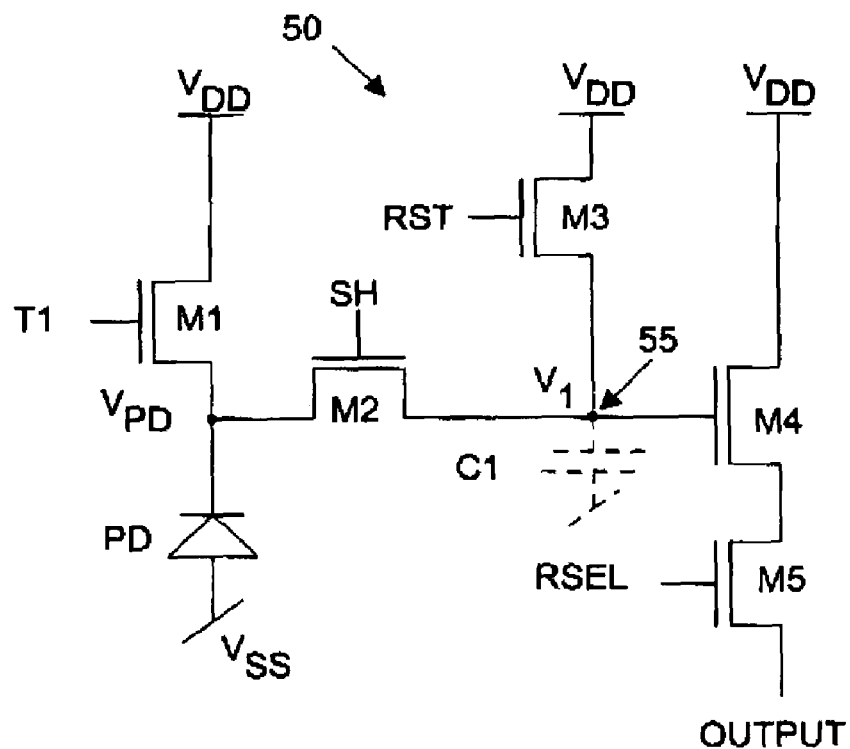

It will be understood that the method according to the present invention is not limited to the operation of a structure such as the structure illustrated in FIG. 2B, but may be applied in a similar manner to any type of structure which takes the schematic form of the structure illustrated in FIG. 2A, i.e. a structure including a photo-sensor element and storage means able to be coupled to a photo-sensor element at a determined instant in order to generate and store a sampled signal representative of charge carriers accumulated by the photo-sensor element during integration. The structure of FIG. 2B nonetheless constitutes a simple and particularly advantageous structure.

It will be recalled first of all that the first initialisation signal T1 of transistor M1 assures initialisation of photodiode PD, before each integration period, at a determined initialisation voltage. First initialisation signal T1 is applied globally to the sensors pixels, i.e. photodiodes PD of all the sensor pixels are simultaneously initialised, at the beginning of each integration period, at an initialisation voltage.

Likewise, sampling signal SH is applied globally to the sensor pixels, so that the photodiode voltages are simultaneously sampled and stored at pixel memory node 55.

Second initialisation signal RST is applied either globally, or line by line. As will be seen in detail hereinafter, this second initialisation signal is first of all applied globally in order to initialise the memory node of each pixel at a determined initialisation voltage, then, in a subsequent phase, it is applied line by line during the read process.

The line selection signal RSEL is applied line by line during the read process.

The method according to the present invention can be broken down into several successive phases which will each be described hereinafter. During a first phase A, called the initialisation phase, the first and second initialisations signals T1 and RST are both brought to a high positive voltage level so as to initialise respectively photodiode PD and memory node 55 of each pixel at a determined initialisation voltage.

During this first phase A, sampling signal SH is at a low level so that transistor M2 is not conductive, thus uncoupling photodiode PD and memory node 55. Likewise, line selection signal RSEL is at a low level so that line selection transistor M5 is not conductive.

The resulting voltages $V_{PD}$ and $V_1$ across photodiode PD and at memory node 55 are thus respectively at levels substantially equal to the determined initialisation voltage.

During a second phase B, first initialisation signal T1 passes to a low level making transistor M1 not conductive. Via the effect of illumination, photodiodes PD begin to be discharged in a proportional manner to the quantity of light each of them receives as is shown by the evolution of voltage $V_{PD}$ in FIG. 3. It will be understood that the passage of initialisation signal T1 from a high level to a low level thus gives the start of the exposure of the sensor to light. This is the beginning of the integration period.

During the whole of second phase B, second initialisation signal RST is held at a level such that the voltage of memory node 55 of each pixel is held at a constant value substantially equal to the determined initialisation voltage.

At the end of second phase B, second initialisation signal RST passes to a low level, thus releasing memory node 55. A third phase C then directly follows this passage of initialisation signal RST from a high level to a low level. During this phase, sampling signal SH passes briefly to a high level allowing transistor M2 to be made conductive and thus allowing the voltage value across photodiode PD to be sampled and stored, via sampling transistor M2, on memory node 55. The voltage $V_1$ of memory node 55 thus evolves as shown by FIG. 3. The end of this third phase C thus determines the end of the exposure time of the sensor. Indeed, at this stage, memory node 55 of each pixel has stored a voltage value representative of the quantity of charges which have been generated under photodiode PD during the exposure of the sensor.

Shortly after the sampling signal passes to the low level, the first initialisation signal T1 is again brought to a level such that each photodiode is again initialised at a voltage substantially equal to the initialisation voltage. Consequently, any charge which might be generated via the effect of light on the photodiode is drained via transistor M1. The sampled voltage stored on the memory node of each pixel of the sensor is thus not disturbed by the phenomenon of charge carrier diffusion, so that the voltage present at this memory node remains constant.

During a fourth phase D, or read phase, each pixel line of the sensor can thus be read in succession without running the risk of the capacitor of the memory nodes being discharged via the effect of photo-generated charges which would diffuse in the substrate. During the fourth phase D, each line is addressed in succession in order to allow the sampled voltages of each pixel to be read via the output bus of each column. At the end of this fourth phase, the signals are applied in the same way as in first initialisation phase A and the next acquisition operation can begin.

Preferably, this read operation is effected in accordance with a technique known to those skilled in the art known by the name of correlated double sampling or CDS. According to this known technique, the operation of reading each line is broken down into a first phase of reading the voltage present on the memory nodes of the pixels in one line followed by a second read phase in which the memory nodes of the pixels in the line are reinitialised. A signal formed of the difference between the measured sampled voltage and the initialisation voltage of the memory node is then generated for each pixel. This technique allows fixed pattern noise to be eliminated, i.e. the noise present at each pixel of the sensor which is due to the slight differences in sensitivity which can exist between the pixels. As FIG. 3 shows, both line selection signal RSEL and the second initialisation signal RST are thus applied line by line during fourth phase D.

It will thus be understood that according to the present invention, all the pixels are exposed simultaneously and reading can then be effected line by line without any risk of the sampled data being damaged by the phenomenon of charge carrier diffusion. The CMOS image sensor operated according to the present invention thus operates like a camera using a mechanical shutter. In a way, the sampling transistors M2 together fulfil the function of an electronic shutter.

By way of improvement against the charge carrier diffusion phenomenon, it is preferable to rely on n-well type photodiodes, i.e. photodiodes formed in n type well. This structure offers the advantage of forming a better obstacle to the diffusion of charge carriers than a conventionally formed photodiode structure, for example a simple region of n type diffusion.

Numerous modifications and/or improvements to the present invention may be envisaged without departing from the scope of the invention defined by the annexed claims. In particular, the pixel structure used by way of example to illustrate the method according to the present invention could in theory be made by means of complementary p-mos technology or, if necessary, include additional transistors. It will be understood for example that sampling transistor M2 essentially has the role of uncoupling the photodiode and the memory node of the pixel and that other arrangements may be provided to fulfil this function.

What is claimed is:

1. A method for operating a CMOS image sensor including a matrix of pixels arranged in a plurality of lines and columns, each of said pixels including a photosensor element accumulating charge carriers in proportion to the illumination thereof, at least a MOS transistor and storage means able to be coupled to said photosensor element by means of the MOS transistor at a determined instant in order to generate a sampled signal representative of said charge carriers accumulated by said photosensor, said storage means being intended to assure storage for the purpose of reading said sampled signal, wherein, said method includes:
 a first phase or initialisation phase, during which said photosensor element and said storage means are initialised at a determined initialisation voltage;
 a second phase or exposure phase during which said photosensor element is released from said initialisation voltage and generates charge carriers in proportion to its illumination, said photosensor element and said storage means being uncoupled from each other by means of the MOS transistor;
 a third phase or sampling phase during which said sampled signal which is generated and stored on said storage means by coupling said photosensor element to said storage means by means of the MOS transistor; and
 a fourth phase or reading phase, during which said sampled signal which is stored on said storage means is read, said photosensor element and said storage means being uncoupled from each other by means of the MOS transistor, and wherein during said fourth phase, said photosensor element is held at a voltage such that any charge carrier generated by said photosensor element is drained and thus does not disturb said sampled signal stored on said storage means, and wherein:
 during said first phase, said photosensor element and said storage means are uncoupled from each other by means of the MOS transistor;
 during said third phase said storage means, in a first stage, is released from said initialisation voltage, then, in a second stage, is briefly coupled to said photosensor element, thus allowing said sampled signal to be generated and stored in said storage means, and
 during said fourth phase said photosensor element, in a first stage, is again initialised at said determined initialisation voltage, then, in a second stage, said sampled signal which is stored on said storage means is read.

2. A method for operating a CMOS image sensor including a matrix of pixels arranged in plurality of lines and columns, each of said pixels including a photosensor element accumulating charge carriers in proportion to the illumination thereof, at least a MOS transistor and storage means able to be coupled to said photosensor element by means of the MOS transistor at a determined instant in order to generate a sampled signal representative of said charge carriers accumulated by said photosensor, said storage means being intended to assure storage for the purpose of reading said sampled signal, wherein, said method includes;
 a first phase or initialisation phase, during which said photosensor element and said storage means are initialised at a determined initialisation voltage;
 a second phase or exposure phase during which said photosensor element is released from said initialisation voltage and generates charge carriers in proportion to its illumination, said photosensor element and said storage means being uncoupled from each other by means of the MOS transistor;
 a third phase or sampling phase during which said sampled signal which is generated and stored on said storage means by coupling said photosensor element to said storage means by means of the MOS transistor; and
 a fourth phase or reading phase, during which said sampled signal which is stored on said storage means is read, said photosensor element and said storage means being uncoupled from each other by means of the MOS transistor, and wherein during said fourth phase, said photosensor element is held at a voltage such that any charge carrier generated by said photosensor element is drained and thus does not disturb said sampled signal stored on said storage means, and wherein:
 during said first phase, said photosensor element and said storage means are uncoupled from each other by means of the MOS transistor;
 during said third phase said storage means, in a first stage, is released from said initialisation voltage, then, in a second stage, is briefly coupled to said photosensor element, thus allowing said sampled signal to be generated and stored in said storage means, and
 during said fourth phase said photosensor element, in a first stage, is again initialised at said determined initialisation voltage, then, in a second stage, said sampled signal which is stored on said storage means is read, and wherein each pixel includes a reverse polarised photodiode forming said photosensor element and at least a first, a second and a third MOS transistor, said photodiode being connected, on one hand, to a first supply voltage and, on the other hand, to the sources of said first and second transistors, the drains of said first and third transistors being connected to a second supply voltage, the drain of said second transistor and the source of said third transistor being connected to each other and forming a memory node of said storage means, wherein:
 during said first phase, a first initialisation signal and a second initialisation signal applied respectively to the gate of said first and third transistors of each pixel are brought to levels such that, respectively, said photodiode and said memory node are initialised at a determined initialisation voltage, a control signal applied to the gate of said second transistor of each pixel being brought to a level such that said photodiode and said memory node are uncoupled;
 during said second phase, said first initialisation signal is brought to a level such that said photodiode is released from said initialisation voltage and accumulates charge carriers in proportion to its illumination;
 during said third phase, said second initialisation signal, in a first stage, is brought to a level such that said memory node is released from said initialisation voltage, and said control signal, in a second stage, is briefly brought to a level such that said photodiode and said memory node are coupled, thus allowing the sampled signal to be generated and stored on said memory node, and
 during said fourth phase, said first initialisation signal is first brought to a level such that said photodiode is again initialised at said determined initialisation voltage, and said sampled signal, stored on said memory node, is read.

3. A method according to claim 2, wherein each pixel further includes fourth and fifth MOS transistors, the gate, the drain and the source of said fourth transistor being respectively connected to said memory node, to said second supply voltage, and to the drain of said fifth transistor, the source of said fifth transistor supplying a signal representative of the sampled signal present on said memory node when a line selection signal is applied to the gate of said fifth transistor,
 wherein during said fourth phase each line of pixels is addressed in succession so as to allow the sampled signals present on the memory nodes of all the pixels in one line to be read.

4. A method according to claim 3, wherein, following each reading of a line of pixels during said fourth phase, said second initialisation signal applied to each third transistor in said line of pixels is brought to a level such that each memory node in said line of pixels is again initialised at said determined initialisation voltage, the signal then present on each memory node in the line of pixels being used to generate a signal representative of the difference between the signal present on each memory node before and after initialisation.

5. A method according to claim 2, wherein the photodiode is formed in an n type well and in that said transistors are n-MOS transistors.

* * * * *